United States Patent
Wang et al.

(10) Patent No.: US 10,558,315 B2
(45) Date of Patent: Feb. 11, 2020

(54) TOUCH PANEL AND DISPLAY APPARATUS (71) Applicants: BOE Technology Group Co., Ltd., Beijing (CN); Beijing BOE Optoelectronics Technology Co., Ltd., Beijing (CN)

(72) Inventors: Pengpeng Wang, Beijing (CN); Xue Dong, Beijing (CN); Hailin Xue, Beijing (CN); Xiaochuan Chen, Beijing (CN); Haisheng Wang, Beijing (CN); Xiaoliang Ding, Beijing (CN); Yingming Liu, Beijing (CN); Shengji Yang, Beijing (CN); Weijie Zhao, Beijing (CN); Changfeng Li, Beijing (CN); Wei Liu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/529,875

(22) PCT Filed: May 30, 2016

(86) PCT No.: PCT/CN2016/083869
§ 371 (c)(1),
(2) Date: May 25, 2017

(87) PCT Pub. No.: WO2017/166415
PCT Pub. Date: Oct. 5, 2017

(65) Prior Publication Data
US 2018/0239473 A1    Aug. 23, 2018

(30) Foreign Application Priority Data
Mar. 29, 2016  (CN) ........................ 2016 1 0187210

(51) Int. Cl.
G06F 3/045 (2006.01)
G06F 3/041 (2006.01)
H01L 27/32 (2006.01)

(52) U.S. Cl.
CPC ............ *G06F 3/045* (2013.01); *G06F 3/0412* (2013.01); *G06F 3/0416* (2013.01); *H01L 27/322* (2013.01); *H01L 27/323* (2013.01)

(58) Field of Classification Search
CPC ...... G06F 3/045; G06F 3/0416; G06F 3/0412; H01L 27/323; H01L 27/322
See application file for complete search history.

(56) References Cited

U.S. PATENT DOCUMENTS

2007/0252729 A1* 11/2007 Li ..................... G06F 3/0213
                                                                    341/22
2008/0296073 A1* 12/2008 McDermid ............ G06F 3/045
                                                                    178/18.05

(Continued)

FOREIGN PATENT DOCUMENTS

CN    102539022 A    7/2012
CN    103162875 A    6/2013

(Continued)

OTHER PUBLICATIONS

Written Opinion of the International Searching Authority dated Jan. 6, 2017 corresponding to International application No. PCT/CN2016/083869.

(Continued)

*Primary Examiner* — Aneeta Yodichkas
(74) *Attorney, Agent, or Firm* — Nath, Goldberg & Meyer; Joshua B. Goldberg; Daniel Bissing (57) ABSTRACT Provided touch panel and display apparatus belonging to the field of display technology. The touch panel includes first and second substrates disposed facing to each other, a plurality of touch control units disposed on surface of first (Continued)

substrate facing second substrate, and a plurality of read lines and a plurality of control lines; each touch control unit includes first and second patches disposed, side by side, facing to second substrate, and pressure conductive pillar between first patch and second substrate; pressure conductive pillar is configured to transfer a pressure, which occurs when touch control unit receives press, to first patch of touch control unit; each touch control unit is configured to be turned on by control signal inputted through corresponding control line, and read out, through corresponding read line, pressure signal for first and second patches so as to determine position of touch point at which a press occurs.

15 Claims, 3 Drawing Sheets

(56) References Cited

U.S. PATENT DOCUMENTS

| | | | |
|---|---|---|---|
| 2013/0076687 A1 | 3/2013 | Giddings et al. | |
| 2013/0135256 A1* | 5/2013 | Hong | G06F 3/042 |
| | | | 345/175 |
| 2015/0261367 A1* | 9/2015 | Zhang | G06F 3/0412 |
| | | | 345/173 |
| 2016/0188039 A1* | 6/2016 | Yoon | G06F 3/044 |
| | | | 345/174 |
| 2017/0038879 A1* | 2/2017 | Hsiao | G06F 3/0414 |
| 2017/0123548 A1* | 5/2017 | Shih | G06F 3/0414 |

FOREIGN PATENT DOCUMENTS

| | | |
|---|---|---|
| CN | 104598066 A | 5/2015 |
| CN | 105117055 A | 12/2015 |
| CN | 105224129 A | 1/2016 |
| CN | 105260058 A | 1/2016 |
| CN | 105335004 A | 2/2016 |
| CN | 105404430 A | 3/2016 |
| WO | 2015106183 A1 | 7/2015 |

OTHER PUBLICATIONS

International Search Report dated Jan. 6, 2017 corresponding to International application No. PCT/CN2016/083869.
First Office Action dated Mar. 1, 2018 corresponding to Chinese application No. 201610187210.5.

* cited by examiner

TOUCH PANEL AND DISPLAY APPARATUS

This is a National Phase application filed under 35 U.S.C. 371 as a national stage of PCT/CN2016/083869, filed May 30, 2016, an application claiming the benefit of Chinese Application No. 201610187210.5, filed Mar. 29, 2016, the content of each of which is hereby incorporated by reference in its entirety.

FIELD

The present invention belongs to the field of display technology, and specifically relates to a touch panel and a display apparatus.

BACKGROUND

A touch panel, due to its advantages such as ease of operation, visualization and flexibility, has become a popular human-computer interaction means for personal mobile communication device and integrated information terminal (e.g., tablet computers, smart phones, super notebook computers, etc.). Depending on different principles of touch control, touch panels can be divided into four main types of resistive touch panel, capacitive touch panel, infrared touch panel and surface acoustic wave (SAW) touch panel. A capacitive touch panel has a multi-touch function, and has an excellent user experience with fast response, long lifetime and high light transmittance. With gradual development of the process, the yield of the capacitive touch panel has been significantly improved, and its price has been increasingly reduced, thereby becoming a mainstream technology for touch control interaction of small and medium-sized information terminal.

However, it has been found that there is a lack of realizing display with touch control by using pressure sensors in the field of touch control. Accordingly, the present disclosure provides, inter alia, a technical solution of adopting, as a pressure sensor, resistive strain gauges in the touch panel.

SUMMARY

In view of the above problems in the existing touch panels, the present disclosure provides a touch substrate and a display apparatus, in which a function of touch control is realized by using pressure sensors.

One aspect of the present disclosure provides a touch panel, which includes first and second substrates disposed facing to each other, a plurality of touch control units disposed on a surface of the first substrate facing the second substrate, and a plurality of read lines and a plurality of control lines; each of the plurality of touch control units includes first and second patches disposed, side by side, facing the second substrate, and a pressure conductive pillar disposed between the first patch and the second substrate; the pressure conductive pillar is configured to transfer a pressure, which occurs when the touch control unit receives a press, to the first patch of the touch control unit; each of the plurality of touch control units is configured to be turned on under a control of a control signal inputted through a corresponding one of the plurality of control lines, and read out, through a corresponding one of the plurality of read lines, a pressure signal for the first and second patches in the touch control unit so as to determine a position of a touch point at which a press occurs.

Optionally, the pressure conductive pillar is disposed on the first patch; or, the pressure conductive pillar is disposed at a position, corresponding to the first patch, on a surface of the second substrate facing the first substrate.

Optionally, the plurality of control lines and the plurality of read lines intersect and are insulated from each other, each intersection of the plurality of control lines and the plurality of read lines defining one of the touch control units; wherein each of the plurality of touch control units further includes a switch transistor having a first electrode electrically connected to the first and second patches of the touch control unit, respectively; second electrodes of the switch transistors of the touch control units in a same column are commonly connected to a same one of the plurality of read lines, and control electrodes of the switch transistors of the touch control units in a same row are commonly connected to a same one of the plurality of control lines.

Optionally, each of the plurality of touch control units further includes a detecting and amplifying unit, which is configured to convert, to the pressure signal, a difference in resistance values of the first patch and the second patch of the touch control unit and amplify the pressure signal so as to output the amplified pressure signal through the read line.

Further optionally, the detecting and amplifying unit is configured to be a bridge detection circuit, and the first and second patches of one touch control unit serve as two respective resistors of a bridge in the detecting and amplifying unit of the one touch control unit.

Further optionally, the detecting and amplifying unit includes an amplifying circuit, a switch transistor, a first resistor and a second resistor, wherein the first resistor, the second resistor, the first patch and the second patch constitute the bridge in the detecting and amplifying unit, a node at which the first resistor and the first patch are connected serving as a first end of the bridge, a node at which the first patch and the second patch are connected serving as a second end of the bridge, a node at which the second patch and the second resistor are connected serving as a third end of the bridge, a node at which the second resistor and the first resistor are connected serving as a fourth end of the bridge; the amplifying circuit has a first input port, a second input port and an output port, and is configured to output the pressure signal in a form of voltage; and wherein a first electrode of the switch transistor is connected to the second end of the bridge, and a second electrode of the switch transistor is connected to the first input port of the amplifying circuit; the first end of the bridge is connected to a power supply voltage port, the third end of the bridge is connected to a low voltage port or a ground port, and the fourth end of the bridge is connected to the second input port of the amplifying circuit.

Further optionally, the amplifying circuit includes a fifth resistor, a sixth resistor, a seventh resistor, an eighth resistor and an operational amplifier, wherein the operational amplifier has a positive input port, a negative input port and an output port; a first end of the fifth resistor is connected to the first input port of the amplifying circuit, a second end of the fifth resistor is connected to the negative input port of the operational amplifier and a first end of the seventh resistor; a first end of the sixth resistor is connected to the second input port of the amplifying circuit, and a second end of the sixth resistor is connected to the positive input port of the operational amplifier and a first end of the eighth resistor; a second end of the seventh resistor is connected to the output port of the operational amplifier, which serves as the output port of the amplifying circuit; and a second end of the eighth resistor is connected to a reference voltage port.

Optionally, the bridge is a Wheatstone bridge.

Optionally, the touch panel further includes an acquisition unit and a processing unit; wherein the acquisition unit is configured to acquire pressure signals which are read through respective read lines; and the processing unit is configured to analyze and process the pressure signals to determine the position of the touch point at which a press occurs.

Optionally, each of the first patch and the second patch has a wiring pattern including at least two portions configured to sense pressures in different directions, respectively.

Further optionally, each of the at least two portions has a wiring pattern of a zigzag shape, the wiring pattern of one of the at least two portions extending in a direction perpendicular to that of a different one of the at least two portions.

Optionally, each of the first patch and the second patch has a wiring pattern of a spiral shape.

Optionally, each of the first patch and the second patch is a resistive strain gauge.

Optionally, each of the first patch and the second patch includes any one of constantan, an alloy of nickel and aluminum, a Kama alloy, and an alloy of iron, chromium and aluminum.

Optionally, one of the first and second substrates is an array substrate and the other is a color filter substrate; alternatively, one of the first and second substrates is a color-filter-on-array substrate or an organic light-emitting diode backplane, and the other is a counter substrate.

Further optionally, the first substrate is any one of an array substrate, a color-filter-on-array substrate and an organic light-emitting diode backplane, and the first substrate includes display transistors; the plurality of control lines and the plurality of read lines intersect and are insulated from each other, each intersection of the plurality of control lines and the plurality of read lines defining one of the plurality of touch control units; each of the plurality of touch control units includes a switch transistor having a first electrode electrically connected to the first and second patches of the touch control unit, second electrodes of the switch transistors of the touch control units in a same column are commonly connected to a same read line, and control electrodes of the switch transistors of the touch control units in a same row are commonly connected to a same control line; the display transistors and the switch transistors have different switching characteristics, and control electrodes of the switch transistors of the touch control units and the display transistors in a same row are commonly connected to a same control line, such that when applied with a same control signal, one of the switch transistors and the display transistors are turned on and the other are turned off.

Another aspect of the present disclosure provides a display apparatus including the touch panel described above.

The beneficial effects of the embodiments of the present invention are as follows.

In the touch panel according to embodiments of the present invention, when a press is applied to a position of a touch panel by a finger, a portion of the touch panel at the position is deformed due to the press, such that the first patch of the touch control unit at the position contacts the pressure conductive pillar of the touch control unit, and thus the resistance value of the first patch is changed when the first patch receives the press while the resistance value of the second patch is unchanged due to not being pressed. At this time, the pressure signal corresponding to a difference in resistance values of the first patch and the second patch can be read out through the read line, so as to determine the position of the touch point where a press occurs.

Reference numerals: 10. first substrate; 20. second substrate; 30. touch control unit; 31. first patch; 32. second patch; 33. pressure conductive pillar; 40. control line; 50. read line; 60. detecting and amplifying unit; 601. bridge; 602. amplifying circuit; 6021. operational amplifier.

DETAILED DESCRIPTION

To make those skilled in the art better understand the technical solutions of the present disclosure, the present disclosure will be further described in detail below in conjunction with the accompanying drawings and specific implementations.

Figure 1:
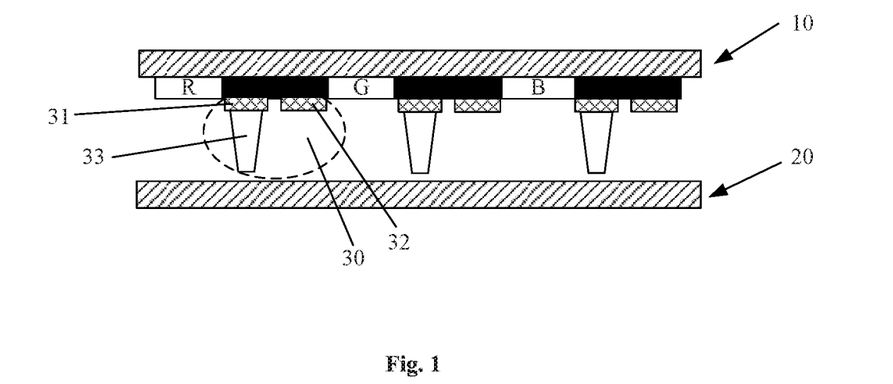
FIGS. 1 to 4 are schematic structural diagrams of a touch panel according to an embodiment of the present invention.
Figure 6:
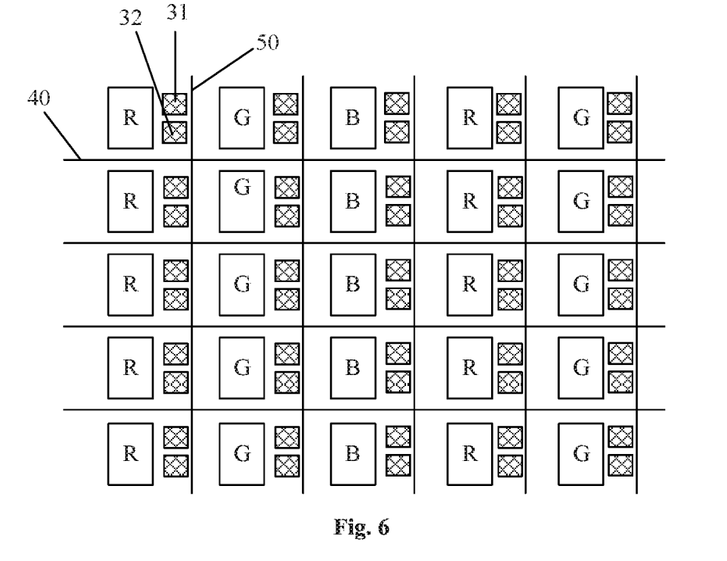
FIG. 6 is a schematic structural diagram of an example of a touch panel according to an embodiment of the present invention.

In one aspect, as illustrated in FIG. 1, an embodiment of the present invention provides a touch panel, which includes first and second substrates 10 and 20 disposed facing to each other, a plurality of touch control units 30 disposed on a surface of the first substrate 10 facing the second substrate 20, and a plurality of read lines 50 and a plurality of control lines 40 (as illustrated in FIG. 6); each of the plurality of touch control units 30 includes first and second patches 31 and 32 disposed, side by side, on the surface of the first substrate 10 facing the second substrate 20, and a pressure conductive pillar 33 disposed between the first patch 31 and the second substrate 20; the pressure conductive pillar 33 is configured to transfer a pressure, which occurs when the touch control unit 30 receives a press, to the first patch 31 of the touch control unit 30; the first patch 31 and the second patch 32 of each touch control unit 30 are electrically connected to one control line 40 and one read line 50, respectively; each of the plurality of touch control units 30 is configured to operate under a control of a control signal inputted through a corresponding one of the plurality of control lines 40, and read out, through a corresponding one of the plurality of read lines 50, a pressure signal for the first and second patches 31 and 32 in the touch control unit so as to determine a position of a touch point at which a press occurs.

Optionally, each of the first patch 31 and the second patch 32 is a resistive strain gauge. When a press is applied to a position of the touch panel by a finger, a portion of the touch panel at that position is deformed due to the press, such that the first substrate 10 and the second substrate 20 contact each other through the pressure conductive pillar 33 in the touch control unit 30 at that position. The first patch 31 in the touch control unit 30 has a position corresponding to that of the press conductive pillar 33, and thus the resistance value of the first patch 31 is changed when the first patch 31 receives the press while the resistance value of the second patch 32 is unchanged due to not being pressed. At this time, the pressure signal corresponding to a difference in resistance values of the first patch 31 and the second patch 32 may be read out through the read line 50 so as to determine the position of a touch point at which the press occurs.

As an example of the present embodiment, as illustrated in FIG. 1, the first substrate 10 of the touch panel is a color filter substrate, and the second substrate 20 is an array substrate. The first and second patches 31 and 32 of each touch control unit 30 are both disposed on a surface of the color filter substrate facing the array substrate, and the pressure conductive pillar 33 of each touch control unit 30 is disposed on the first patch 31 of the touch control unit 30. At this time, respective control lines 40 are applied with control signals; when a press is applied to a position of the color filter substrate by a finger, a portion of the color filter substrate at that position is deformed due to the press, such that the pressure conductive pillar 33 of the touch control unit 30 at that position on the color filter substrate contacts the array substrate. Thus, the resistance value of the first patch 31 disposed on the pressure conductive pillar 33 is changed due to receiving the press while the resistance value of the second patch 32 corresponding to the first patch 31 (i.e., the second patch 32 in the same touch control unit 30) is unchanged due to not receiving the press. Accordingly, when the press occurs, a difference (corresponding to the pressure signal described herein) in resistance values of the first patch 31 and the second patch 32 of the touch control unit 30 at the press position will be changed. That is to say, coordinate of the touch point can be determined by reading out the pressure signal corresponding to the first patch 31 and the second patch 32 of each touch control unit 30 through the read line 50.

Figure 2:
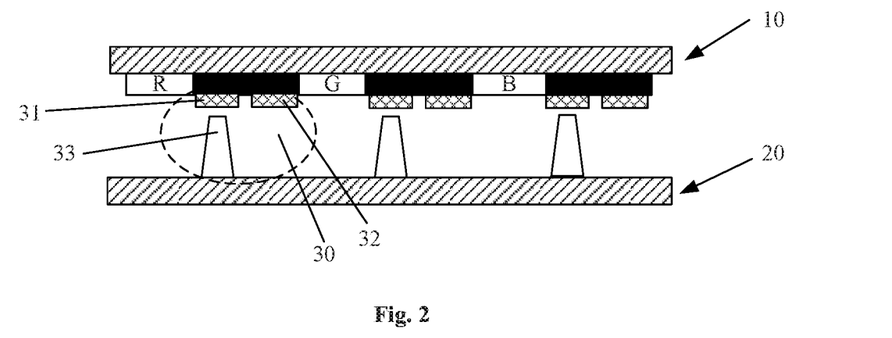

As an equivalent variation of the above example, as illustrated in FIG. 2, the press conductive pillar 33 in each touch control unit 30 may be disposed, on the array substrate, at a position corresponding to the first patch 31 of the touch control unit 30. In this case, when a press is applied to a position of the color filter substrate by a finger, a portion of the color filter substrate at that position is deformed due to being subjected to the pressure, such that the first patch 31 of the touch control unit 30 at the position on the color filter substrate contacts the pressure conductive pillar 33 on the array substrate. Similarly, the resistance value of the first patch 31 is changed due to receiving the press. A principle of the equivalent variation is the same as that of the above example and is not described in detail herein.

Correspondingly, the first substrate 10 of the touch panel in the above example may be a counter substrate, and the second substrate 20 thereof may be a color-filter-on-array (COA, i.e., the color filter being disposed on the array substrate) substrate or an organic light-emitting diode (OLEO) backplane.

Figure 3:
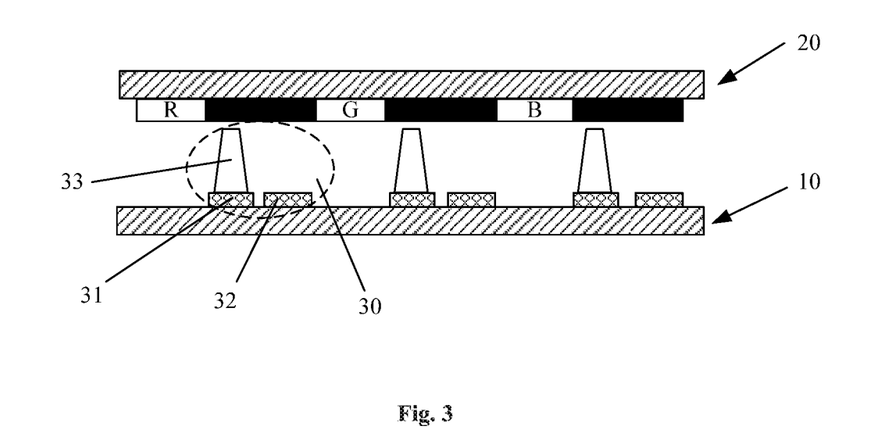

As another example of the present embodiment, as illustrated in FIG. 3, the first substrate 10 of the touch panel is an array substrate, and the second substrate 20 is a color filter substrate. The first and second patches 31 and 32 of each touch control unit 30 are both disposed on a surface of the array substrate facing the color filter substrate, and the pressure conductive pillar 33 of each touch control unit 30 is disposed on the first patch 31 of the touch control unit 30. At this time, respective control lines 40 are applied with control signals; when a press is applied to a position of the color filter substrate by a finger, a portion of the touch panel at that position is deformed due to the press, such that the pressure conductive pillar 33 of the touch control unit 30 at that position on the array substrate contacts the color filter substrate. Thus, the resistance value of the first patch 31 of the touch control unit 30 is changed when it receives the press while the resistance value of the second patch 32 of the touch control unit 30 is unchanged due to not receiving the press. Accordingly, coordinate of the touch point can be determined by reading out the pressure signal corresponding to a difference in resistance values of the first patch 31 and the second patch 32 of each touch control unit 30 through the read line 50.

Figure 4:
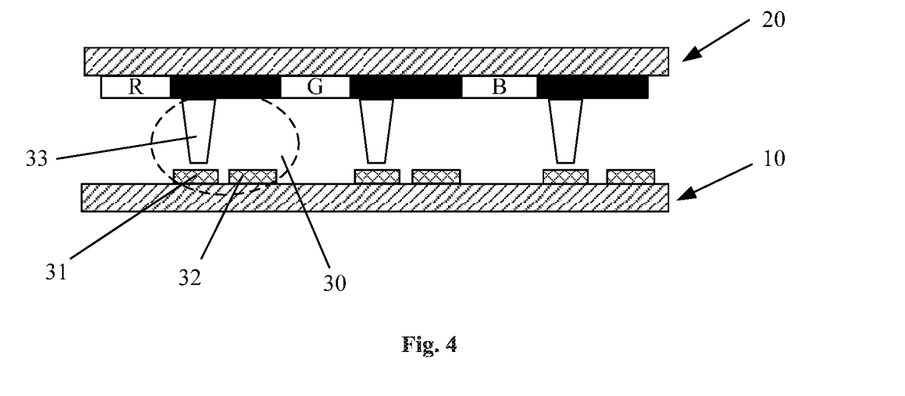

As an equivalent variation of the above example, as illustrated in FIG. 4, the press conductive pillar 33 in each touch control unit 30 may be disposed, on the color filter substrate, at a position corresponding to the first patch 31 of the touch control unit 30. In this case, when a press is applied to a position of the color filter substrate by a finger, a portion of the color filter substrate at that position is deformed due to being subjected to the pressure, such that the color filter substrate and the array substrate contact each other through the pressure conductive pillar 33 of the touch control unit 30 at the position. A principle of the equivalent variation is the same as that of the above example and is not described in detail herein.

Correspondingly, the first substrate 10 of the touch panel in the above example may be a color-filter-on-array (COA, i.e., the color filter being disposed on the array substrate) substrate or an organic light-emitting diode (OLED) backplane, and the second substrate 20 thereof may be a counter substrate.

Optionally, regardless of the specific configuration of the above touch panel, each touch control unit 30 in the present embodiment further includes a detecting and amplifying unit 60, which is configured to convert, to the pressure signal, the difference in resistance values of the first patch 31 and the second patch 32 in the same touch control unit 30 and amplify the pressure signal, thereby outputting the amplified pressure signal through the read line 50. The detecting and amplifying unit 60 is disposed for the reason that, the resistance value of the first patch 31 of the touch control unit 30 is changed when the first patch 31 receives the press while the resistance value of the second patch 32 is unchanged due to not being pressed. At this time, the detecting and amplifying unit 60 may calculate a voltage signal (i.e., the pressure signal) depending on the difference in resistance values of the first patch 31 and the second patch 32, and amplify the voltage signal, and thus it is possible to detect, with higher accuracy, a position of the touch control unit 30 at which a change of the pressure signal occurs, so as to better determine the position of the touch point where the press occurs.

Figure 5:
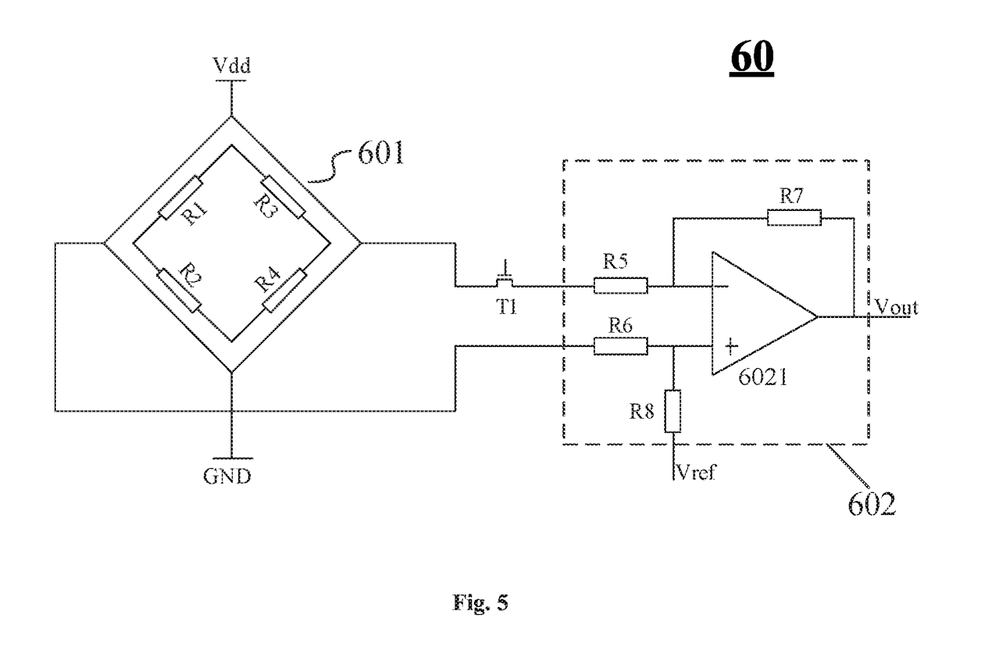
FIG. 5 is a circuit diagram of a detecting and amplifying unit of a touch panel according to an embodiment of the present invention.

Optionally, as illustrated in FIG. 5, the detecting and amplifying unit 60 includes a switch unit, which may be a switch transistor T1 an amplifying circuit 602 having a first input port, a second input port and an output port; and a first resistor R1 and a second resistor R2. The detecting and amplifying unit 60 may be configured to be a detection circuit with a bridge, wherein the first and second patches 31 and 32 serve as two resistors of the bridge, respectively, and the bridge may be a Wheatstone bridge.

Specifically, the first patch 31 in the touch control unit 30 may serve as a third resistor R3 as illustrated in FIG. 5, and the second patch 32 in the touch control unit 30 may serve as a fourth resistor R4 as illustrated in FIG. 5, both of the first and second patches 31 and 32 and first and second resistors R1 and R2 constituting a bridge 601 in the detecting and amplifying unit 60. Optionally, a node at which the first resistor R1 and the third resistor R3 are connected serves as a first end of the bridge 601, which is connected to a power supply voltage port Vdd; a node at which the third resistor R3 and the fourth resistor R4 are connected serves as a second end of the bridge 601, which is connected to a first electrode of the switch transistor T1; a node at which the fourth resistor R4 and the second resistor R2 are connected serves as a third end of the bridge 601, which is connected to a low voltage port (or a ground port) GND; and a node at which the second resistor R2 and the first resistor R1 are connected serving as a fourth end of the bridge 601, which is connected to the second input port of the amplifying circuit 602. A second electrode of the switch transistor T1 is connected to the first input port of the amplifying circuit 602, and a control electrode of the switch transistor T1 is connected to the control line 40.

As illustrate in FIG. 5, the amplifying circuit 602 may include a fifth resistor R5, a sixth resistor R6, a seventh resistor R7, an eighth resistor R8 and an operational amplifier 6021. The operational amplifier 6021 has a positive input port (indicated by a sign "+" in FIG. 5), a negative input port (indicated by a sign "−" in FIG. 5) and an output port. A first end of the fifth resistor R5 is connected to the first input port of the amplifying circuit 602, and a second end of the fifth resistor R5 is connected to the negative input port of the operational amplifier 6021; a first end of the sixth resistor R6 is connected to the second input port of the amplifying circuit 602, and a second end of the sixth resistor R6 is connected to the positive input port of the operational amplifier 6021; a first end of the seventh resistor R7 is connected to the negative input port of the operational amplifier 6021, and the second end of the seventh resistor R7 is connected to the output port of the operational amplifier 6021; a first end of the eighth resistor R8 is connected to the positive input port of the operational amplifier 6021, and a second end of the eighth resistor R8 is connected to a reference voltage port Vref. The operational amplifier 6021 outputs, through its output port, an amplified pressure signal to the read line 50.

Temperatures of the first and second patches 31 and 32 in each touch control unit 30 can be considered as the same due to the fact that the first and second patches 31 and 32 in each touch control unit 30 are disposed very close to each other. When no press occurs, the detecting and amplifying unit 60 outputs zero; even in a case where an environment temperature is changed, variations of the resistances of the two patches are the same, so the detecting and amplifying unit 60 still outputs zero, thereby eliminating the influence of temperature to some extent. When a control signal for turning on the touch control unit 30 is provided through the control line 40, the pressure signal may be obtained by the detecting and amplifying unit 60, and then the pressure signals on respective read lines 50 are acquired and converted, from an analog form to a digital form, by an acquisition unit (not shown in the drawings) of the touch substrate, and the converted signal is transmitted to a processing unit of the touch substrate to be further processed so as to determine the position of the touch point.

It should be noted that, in a case where the first substrate 10 is an OLED backplane, the switch transistor T1 of the touch control unit 30 and the switch transistors (i.e., the display transistors) in an OLED driving circuit may be formed by a same process, so the number of processes is not increased, thereby saving cost and facilitating the mass production. Optionally, the first and second patches 31 and 32 of each touch control unit 30 may be formed to penetrate through an insulation layer on the switch transistor T1 so as to contact the first electrode of the switch transistor T1. In addition, the switch transistor T1 of the touch control unit 30 may have a different conductive type from that of the switch transistors of the OlLED driving circuit, that is, one is an N-type transistor and the other is a P-type transistor. In this case, both of the switch transistor T1 and the switch transistors of the OLED driving circuit can be controlled by a same control signal, i.e., control electrodes of the switch transistors T1 of the touch control units 30 and the display transistors in a same row are commonly connected to a same control line 40, so that the switch transistors T1 and the display transistors are turned on during the touch control and the display, respectively, in a time division manner, and do not affect each other. Similarly, the first substrate 10 may also be an array substrate or a COA substrate, the principle of which is similar to that of the OLED backplane and is not described in detail herein.

Optionally, each of the first patch 31 and the second patch 32 is a metal strain gauge, and is made of any one of constantan, an alloy of nickel and aluminum, a Kama alloy and an alloy of iron, chromium and aluminum, or other noble metals. The sensitivity coefficient K of the metal strain gauges (the first patch 31 and the second patch 32) is defined by the following formula:

$$K = \frac{\Delta R/R}{\Delta l/l} = \frac{\Delta R/R}{\varepsilon};$$

where $\triangle R$ is a variation amount of the resistance of the metal strain gauge, R is a resistance value of the metal strain gauge, $\triangle l$ is a stretched (or compressed) amount of the metal strain gauge by deformation, l is a length of the metal strain gauge, and ε is a vertical strain ratio of the metal strain gauge. When the metal strain gauge is subjected to a stress F, it will be stretched by $\triangle l$, and accordingly, the cross sectional area of the metal strain gauge is reduced by $\triangle S$, and the resistivity of the metal strain gauge is changed by an amount $\triangle \rho$ due to the deformation of crystal lattice, resulting in that the resistance is changed by $\triangle R$. The resistance R of the metal strain gauge is calculated by the following formula:

$$R = \rho \frac{l}{S};$$

its total derivative is:

$$\frac{\Delta R}{R} = \frac{\Delta l}{l} - \frac{\Delta S}{S} + \frac{\Delta \rho}{\rho};$$

which eventually simplifies to the following equation with $S = \pi r^2 = \pi d^2/4$:

$$\frac{\Delta R}{R} = (1 + 2\mu)\varepsilon + \frac{\Delta \rho}{\rho},$$

where μ is the Poisson's ratio of a strain material. In the present disclosure, the variation $\triangle \rho$ in the resistivity ρ of the selected strain gauge material is small and negligible when the strain gauge is applied with a pressure. It can be seen from the above equation that when the term having ρ is neglected, the pressure sensitivity K is only related to the deformation amount.

Figure 7:
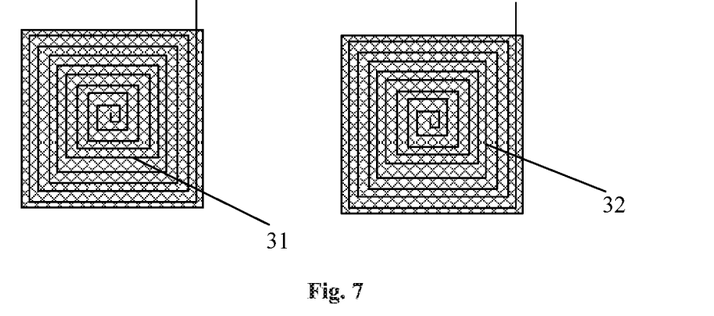
FIGS. 7 and 8 are schematic structural diagrams of a touch control unit of a touch panel according to an embodiment of the present invention.
Figure 8:
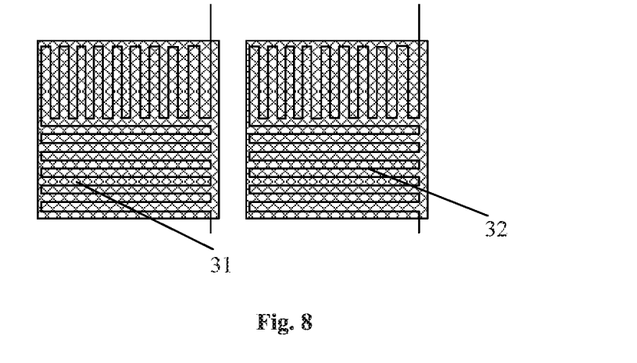

Each of the first patch 31 and the second patch 32 in the touch control unit 30 has a wiring pattern including at least two portions configured to sense pressures in different directions, respectively. Optionally, each of the at least two portions of each of the first and second patches 31 and 32 has a wiring pattern of a zigzag shape, as illustrated in FIG. 8. When a finger presses on the touch panel, the touch substrate is subjected to forces in different directions after being deformed, all these forces in different directions can be decomposed into components in x and y directions perpendicular to each other. Therefore, the wiring patterns of the first and second patches 31 and 32 may be designed to include portions perpendicular to each other and capable of sensing forces in the x and y directions, respectively. As such, the portions of the wiring patterns of the first and second patches 31 and 32 extending in the y direction are provided to sense the component of the force in the y direction, while the portions of the wiring patterns of the first and second patches 31 and 32 extending in the x direction are provided to sense the component of the force in the x direction, and thus the pressure information can be acquired to the greatest extent. To achieve such the effect, the wiring pattern of each of the first and second patches 31 and 32 may be designed to be a wiring pattern of a spiral shape, as illustrated in FIG. 7. The spiral-shaped wiring pattern may be a circular spiral-shaped wiring pattern or a square spiral-shaped wiring pattern. In addition, the wiring patterns of the first and second patches 31 and 32 may also be designed in other form such as a radial pattern, as long as the pressure information can be acquired to the greatest extent.

As illustrated in FIG. 6, as an implementation of the embodiments, the plurality of control lines 40 and the plurality of read lines 50 in the touch panel intersect and are insulated from each other, each intersection of the plurality of control lines 40 and the plurality of read lines 50 defining one of the touch control units 30; wherein each of the touch control units 30 further includes a switch transistor having a first electrode electrically connected to the first and second patches 31 and 32 in a same touch control unit 30, respectively; second electrodes of the switch transistors of the touch control units 30 in a same column are commonly connected to a same read line 50, and control electrodes of the switch transistors of the touch control units 30 in a same row are commonly connected to a same control line 40. By doing this, the arrangement of the wirings is made simple and it is easy to detect the position of the touch point. Specifically, when a signal for activating a first row of the touch control units 30 is inputted through the control line 40 in the first row, the switch transistors of the first row of the touch control units 30 are turned on, and in this case, if a variation of the pressure signal of an X-th touch control unit 30 in the first row is read through one of the plurality of the read lines, it can be determined that a press occurs at a position of the X-th touch control unit in the first row. This approach is simple and easy to implement. The structure of the touch control unit 30 is the same as that described above, and will not be described in detail herein.

In another aspect, an embodiment of the present invention provides a display apparatus including the touch substrate described herein. Therefore, the display apparatus of the embodiment may realize the function of touch control.

The display apparatus may be any product or component with display function, such as an OLED panel, an electronic paper, a mobile phone, a tablet computer, a television, a monitor, a notebook computer, a digital album, a navigator or the like.

It can be understood that the foregoing implementations are merely exemplary embodiments used for describing the principle of the present invention, but the present disclosure is not limited thereto. Those of ordinary skill in the art may make various variations and improvements without departing from the spirit and essence of the present disclosure, and these variations and improvements shall also fall into the protection scope of the present disclosure.

What is claimed is:

1. A touch panel, comprising:
a first substrate and a second substrate disposed facing each other;
a plurality of touch control units disposed on a surface of the first substrate facing the second substrate;
and a plurality of read lines and a plurality of control lines; wherein
each of the plurality of touch control units comprises a first patch and a second patch disposed, side by side, facing the second substrate, and a pressure conductive pillar disposed between the first patch and the second substrate; the pressure conductive pillar is configured to transfer a pressure, which occurs when the touch control unit receives a press, to the first patch of the touch control unit; and
each of the plurality of touch control units is configured to be turned on under a control of a control signal inputted through a corresponding one of the plurality of control lines, and read out, through a corresponding one of the plurality of read lines, a pressure signal for the first patch and the second patch in the touch control unit so as to determine a position of a touch point at which the press occurs,
wherein each of the plurality of touch control units further comprises a detecting and amplifying unit, which is configured to convert, to the pressure signal, a difference in resistance values of the first patch and the second patch of the touch control unit and amplify the pressure signal so as to output the amplified pressure signal through the read line;
wherein the detecting and amplifying unit is configured to be a bridge detection circuit, and the first patch and the second patch of one touch control unit serve as two respective resistors of a bridge in the detecting and amplifying unit of the one touch control unit;
wherein the detecting and amplifying unit comprises an amplifying circuit, a switch transistor, a first resistor and a second resistor;
wherein the first resistor the second resistor, the first patch and the second patch constitute the bridge in the detecting and amplifying unit, a node at which the first resistor and the first patch are connected serving as a first end of the bridge, a node at which the first patch and the second patch are connected serving as a second end of the bridge, a node at which the second patch and the second resistor are connected serving as a third end of the bridge, a node at which the second resistor and the first resistor are connected serving as a fourth end of the bridge,
wherein the amplifying circuit has a first input port, a second input port and an output port, and is configured to output the pressure signal in a form of voltage,
wherein a first electrode of the switch transistor is connected to the second end of the bridge, and a second electrode of the switch transistor is connected to the first input port of the amplifying circuit; and
wherein the first end of the bridge is connected to a power supply voltage port, the third end is connected to the second input port of the amplifying circuit.

2. The touch panel according to claim 1, wherein the pressure conductive pillar is disposed on the first patch; or, the pressure conductive pillar is disposed at a position, corresponding to the first patch, on a surface of the second substrate facing the first substrate.

3. The touch panel according to claim 1, wherein the plurality of control lines and the plurality of read lines intersect and are insulated from each other, each intersection of the plurality of control lines and the plurality of read lines defining one of the touch control units; wherein each of the plurality of touch control units further includes a switch transistor having a first electrode electrically connected to the first patch and the second patch of the touch control unit; second electrodes of the switch transistors of the touch control units in a same column are commonly connected to a same one of the plurality of read lines, and control electrodes of the switch transistors of the touch control units in a same row are commonly connected to a same one of the plurality of control lines.

4. The touch panel according to claim 1, wherein the amplifying circuit comprises a fifth resistor, a sixth resistor, a seventh resistor, an eighth resistor and an operational amplifier, and wherein the operational amplifier has a positive input port, a negative input port and an output port;

a first end of the fifth resistor is connected to the first input port of the amplifying circuit, a second end of the fifth resistor is connected to the negative input port of the operational amplifier and a first end of the seventh resistor;

a first end of the sixth resistor is connected to the second input port of the amplifying circuit, and a second end of the sixth resistor is connected to the positive input port of the operational amplifier and a first end of the eighth resistor;

a second end of the seventh resistor is connected to the output port of the operational amplifier, which serves as the output port of the amplifying circuit; and a second end of the eighth resistor is connected to a reference voltage port.

5. The touch panel according to claim 1, wherein the bridge is a Wheatstone bridge.

6. The touch panel according to claim 1, further comprising an acquisition unit and a processing unit; wherein the acquisition unit is configured to acquire pressure signals which are read through respective ones of the plurality of read lines; and the processing unit is configured to analyze and process the pressure signals to determine the position of the touch point at which the press occurs.

7. The touch panel according to claim 1, wherein each of the first patch and the second patch has a wiring pattern including at least two portions configured to sense pressures in different directions, respectively.

8. The touch panel according to claim 7, wherein each of the at least two portions has a wiring pattern of a zigzag shape, the wiring pattern of one of the at least two portions extending in a direction perpendicular to that of a different one of the at least two portions.

9. The touch panel according to claim 1, wherein each of the first patch and the second patch has a wiring pattern of a spiral shape.

10. The touch panel according to claim 1, wherein each of the first patch and the second patch is a resistive strain gauge.

11. The touch panel according to claim 1, wherein each of the first patch and the second patch comprises any one of constantan, an alloy of nickel and aluminum, a Kama alloy, and an alloy of iron, chromium and aluminum.

12. The touch panel according to claim 1, wherein one of the first substrate and the second substrate is an array substrate and the other of the first substrate and the second substrate is a color filter substrate; or, one of the first substrate and the second substrate is a color-filter-on-array substrate or an organic light-emitting diode backplane, and the other of the first substrate and the second substrate is a counter substrate.

13. The touch panel according to claim 12, wherein the first substrate is any one of an array substrate, a color-filter-on-array substrate and an organic light-emitting diode backplane, and the first substrate comprises display transistors;

the plurality of control lines and the plurality of read lines intersect and are insulated from each other, and each intersection of the plurality of control lines and the plurality of read lines defining one of the plurality of touch control units; each of the plurality of touch control units comprises a switch transistor having a first electrode electrically connected to the first patch and the second patch of the touch control unit, respectively, second electrodes of the switch transistors of the touch control units in a same column are commonly connected to a same read line, and control electrodes of the switch transistors of the touch control units in a same row are commonly connected to a same control line; and the display transistors and the switch transistors have different switching characteristics, and control electrodes of the switch transistors of the touch control units and the display transistors in a same row are commonly connected to a same control line, such that when applied with a same control signal, one of the switch transistors and the display transistors are turned on and the other of the switch transistors and the display transistor are turned off.

14. A display apparatus, comprising the touch panel according to claim 1.

15. The touch panel according to claim 1, wherein each of the plurality of touch control units is configured to determine the position of the touch point at which the press occurs by detecting a difference between a resistance of the first patch and a resistance of the second patch.

* * * * *